United States Patent
Park

(10) Patent No.: US 9,362,462 B2
(45) Date of Patent: Jun. 7, 2016

(54) LIGHT EMITTING DEVICE PACKAGE

(75) Inventor: Seung Ryong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/345,315

(22) PCT Filed: Aug. 3, 2012

(86) PCT No.: PCT/KR2012/006203
§ 371 (c)(1),
(2), (4) Date: Mar. 20, 2014

(87) PCT Pub. No.: WO2013/039293
PCT Pub. Date: Mar. 21, 2013

(65) Prior Publication Data
US 2014/0346547 A1    Nov. 27, 2014

(30) Foreign Application Priority Data
Sep. 15, 2011    (KR) .................. 10-2011-0092868

(51) Int. Cl.
| | |
|---|---|
| H01L 33/50 | (2010.01) |
| H01L 33/64 | (2010.01) |
| H01L 33/60 | (2010.01) |
| H01L 33/48 | (2010.01) |

(52) U.S. Cl.
CPC .............. *H01L 33/50* (2013.01); *H01L 33/483* (2013.01); *H01L 33/507* (2013.01); *H01L 33/60* (2013.01); *H01L 33/64* (2013.01); *H01L 33/641* (2013.01); *H01L 33/644* (2013.01); *H01L 33/486* (2013.01); *H01L 2224/45139* (2013.01); *H01L 2224/48091* (2013.01)

(58) Field of Classification Search
CPC ... H01L 33/507; H01L 33/641; H01L 33/644; H01L 33/60
See application file for complete search history.

(56) References Cited

U.S. PATENT DOCUMENTS

| | | | |
|---|---|---|---|
| 8,552,460 B2* | 10/2013 | Murphy et al. | 257/99 |
| 2003/0230751 A1 | 12/2003 | Harada | |
| 2007/0273274 A1 | 11/2007 | Horiuchi et al. | |
| 2008/0111145 A1 | 5/2008 | Lin | |
| 2009/0261708 A1 | 10/2009 | Moseri et al. | |
| 2009/0295265 A1 | 12/2009 | Tabuchi et al. | |
| 2010/0213810 A1* | 8/2010 | Cho | 313/46 |

FOREIGN PATENT DOCUMENTS

| | | |
|---|---|---|
| CN | 10-1814569 A | 8/2010 |
| CN | 201540904 U | 8/2010 |

(Continued)

OTHER PUBLICATIONS

Office Action dated Sep. 17, 2014 in Taiwanese Application No. 101128428.

(Continued)

*Primary Examiner* — Mark Prenty
(74) *Attorney, Agent, or Firm* — Saliwanchik, Lloyd & Eisenschenk

(57) ABSTRACT

Disclosed is a light emitting device package. The light emitting device package includes a body part provided therein with a cavity, a light emitting chip in the cavity, a cover part to cover the cavity, and a light conversion part provided on a bottom surface of the cover part while being separated from the light emitting chip.

21 Claims, 4 Drawing Sheets

(56) References Cited

FOREIGN PATENT DOCUMENTS

| | | |
|---|---|---|
| EP | 1840977 A1 | 3/2007 |
| JP | 2005-229136 A | 8/2005 |
| JP | 2007-317787 A | 12/2007 |
| JP | 2009-267040 A | 11/2009 |
| JP | 2011-108889 A | 6/2011 |
| KR | 10-0951843 B1 | 4/2010 |

OTHER PUBLICATIONS

International Search Report in International Application No. PCT/KR2012/006203, filed Aug. 3, 2012.
Notice of Allowance dated Feb. 26, 2013, in Korean Application No. 10-2011-0092868, filed Sep. 15, 2011.
Partial European Search Report dated May 6, 2015 in European Application No. 12831934.0.

* cited by examiner

LIGHT EMITTING DEVICE PACKAGE

CROSS-REFERENCE TO RELATED APPLICATIONS

This application is the U.S. national stage application of International Patent Application No. PCT/KR2012/006203, filed Aug. 3, 2012, which claims priority to Korean Application No. 10-2011-0092868, filed Sep. 15, 2011, the disclosures of each of which are incorporated herein by reference in their entirety.

TECHNICAL FIELD

The embodiment relates to a light emitting device package.

BACKGROUND ART

Recently, methods of fabricating nitride gallium (GaN)-based white light emitting diodes (LED), which have actually been researched and studied all over the world, are mainly classified into two methods, in which one method is to acquire a white color by combining a phosphorous material on a blue LED chip or a UV LED chip in the form of a single chip, and the other method is to acquire the white color by combining two or three LED chips with each other in the form of a multiple-chip.

A representative method of realizing a white LED through the form of the multiple-chip is to combine three RGB chips with each other. According to the method, the operating voltage is irregularly represented in each chip, and the output of each chip varies according to the surrounding temperatures so that a color coordinate is changed.

Due to the above problem, the form of the multiple-chip is suitable for a special lighting field of requiring the realization of various colors by adjusting the intensity of each LED through a circuit structure instead of the realization of the white LED.

Accordingly, in order to realize the white LED, a binary system, in which a blue LED easily fabricated and representing superior efficiency and a phosphor pumped by the blue LED to emit yellow light are combined with each other, has been representatively used.

The binary system mainly employs a white LED realized by using the blue LED as a pumping light source and pumping a yttrium aluminum garnet (YAG) phosphor activated by Ce3+, which is a trivalent rare earth element, that is, a YAG:Ce phosphor by the light output from the blue LED.

In addition, the white LED is packaged and used in various forms according to the application fields thereof. Representatively, the white LED is manly used in an ultra micro-size LED device having the type of a surface mounting device (SMD) applicable to backlighting of a cellular phone and a vertical lamp type LED device for an electric board and a solid state display device or an image display.

Meanwhile, indexes used to analyze the characteristic of white light include a correlated color temperature (CCT) and a color rendering index (CRI).

The CCT refers to the temperature of a black body on the assumption the temperature of the black body matches with the temperature of an object when the color of a visible ray emitted from the object seems to be identical to the color radiated from the black body. As the color temperature is increased, a dazzling bluish white color is represented.

In other words, white light having a low color temperature is expressed warmly, and white light having a high color temperature is expressed coldly. Therefore, the white light can satisfy even the characteristic of a special lighting field requiring various colors by adjusting color temperatures.

According to the related art, the white LED using the YAG:Ce phosphor represents only a color temperature of 6000K to 8000K. In addition, the CRI represents the color difference of an object when the sunlight is irradiated onto the object and when other artificial lighting is irradiated onto the object. When the color of the object is identical to the color of the sunlight, the CRI is defined as 100. In other words, the CRI is an index representing the approximation degree of the color of the object under artificial lighting to the color of the object under the sunlight, and has a numeric value of 0 to 100.

In other words, a white light source having a CRI approximating 100 provides a color of an object approximately matching with a color of the object perceived by a human eye under the sunlight.

Recently, when comparing with an incandescent lamp having the CRI of over 80, and the fluorescent lamp having the CRI of over 75, a commercialized white LED represents the CRI of about 70 to about 75.

Therefore, the white LED employing the YAG:Ce phosphor according to the related art represents a relatively low CCT and a relatively low CRI.

In addition, since only the YAG:Ce phosphor is used, the adjustment of the color coordinate, the CCT, and the CRI may be difficult.

In relation to a light emitting diode employing a phosphor as described above, Korean Unexamined Patent Publication No. 10-2005-0098462 has been published.

DISCLOSURE OF INVENTION

Technical Problem

The embodiment provides a light emitting device package which can be easily fabricated, and can represent improved reliability and durability.

Solution to Problem

According to the embodiment, there is provided a light emitting device package including a body part provided therein with a cavity, a light emitting chip in the cavity, a cover part to cover the cavity, and a light conversion part provided on a bottom surface of the cover part while being separated from the light emitting chip.

According to the embodiment, there is provided a light emitting device package including a light emitting chip, a heat transfer layer on the light emitting chip, an adiabatic layer provided on the heat transfer layer to represent thermal conductivity lower than thermal conductivity of the heat transfer layer, a light conversion part on the adiabatic layer, and a heat radiation part connected to the heat transfer layer.

According to the embodiment, there is provided a light emitting device package including a light emitting chip, a first heat transfer layer on the light emitting chip, a first adiabatic layer on the first heat transfer layer, a second heat transfer layer on the first adiabatic layer, a second adiabatic layer on the second heat transfer layer, and a light conversion part on the second adiabatic layer.

Advantageous Effects of Invention

As described above, according to the light emitting device package of the embodiment, the light conversion part is provided on the bottom surface of the cover part. In addition, the light conversion part is spaced apart from the light emitting chip. In other words, after the light conversion part has been provided on the bottom surface of the cover part, the cover part can adhere to the body part.

In other words, the light conversion part is formed on the cover part without directly being formed in the body part. In this case, the bottom surface of the cover part may be flat. The light conversion part can be easily formed on a flat surface. For example, the light conversion part is printed on a transparent plate, and the transparent plate may be cut by a plurality of cover parts. The cover parts may adhere to the body part.

Therefore, the light emitting device package according to the embodiment can be easily fabricated without a process of injecting the light conversion part into the cavity.

In addition, since the light conversion part is spaced apart from the light emitting chip, the heat emitted from the light emitting chip can be prevented from being transferred to the light conversion part. In particular, the heat generated from the light emitting chip can be discharged in a lateral direction by a heat transfer layer and an adiabatic layer.

Accordingly, the light emitting device package according to the embodiment can prevent the light conversion part from being denaturalized by a heat. Therefore, the light emitting device package according to the embodiment can represent improved reliability and improved durability.

MODE FOR THE INVENTION

Figure 1:
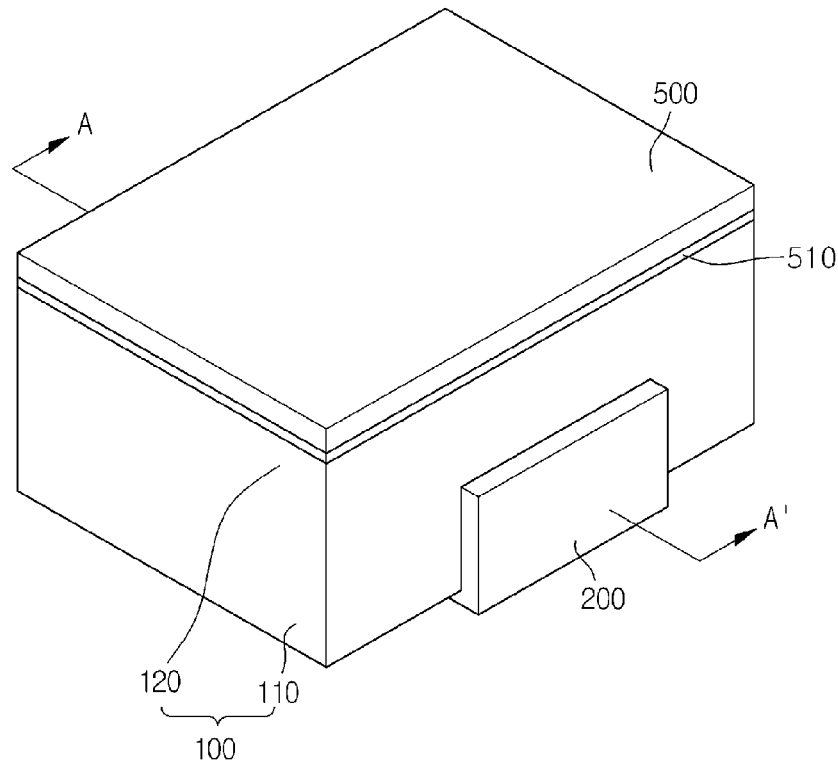
FIG. 1 is a perspective view showing a light emitting diode package according to the embodiment.

In the description of the embodiments, it will be understood that when, a substrate, a layer, a film, or an electrode is referred to as being "on" or "under" another substrate, another layer, another film, or another electrode, it can be "directly" or "indirectly" on the other substrate, layer (or film), region, pad, or pattern, or one or more intervening layers may also be present. Such a position of the layer has been described with reference to the drawings. The size of each element shown in the drawings may be exaggerated, omitted or schematically drawn for the purpose of convenience or clarity. In addition, the size of the element does not utterly reflect an actual size.

Figure 2:
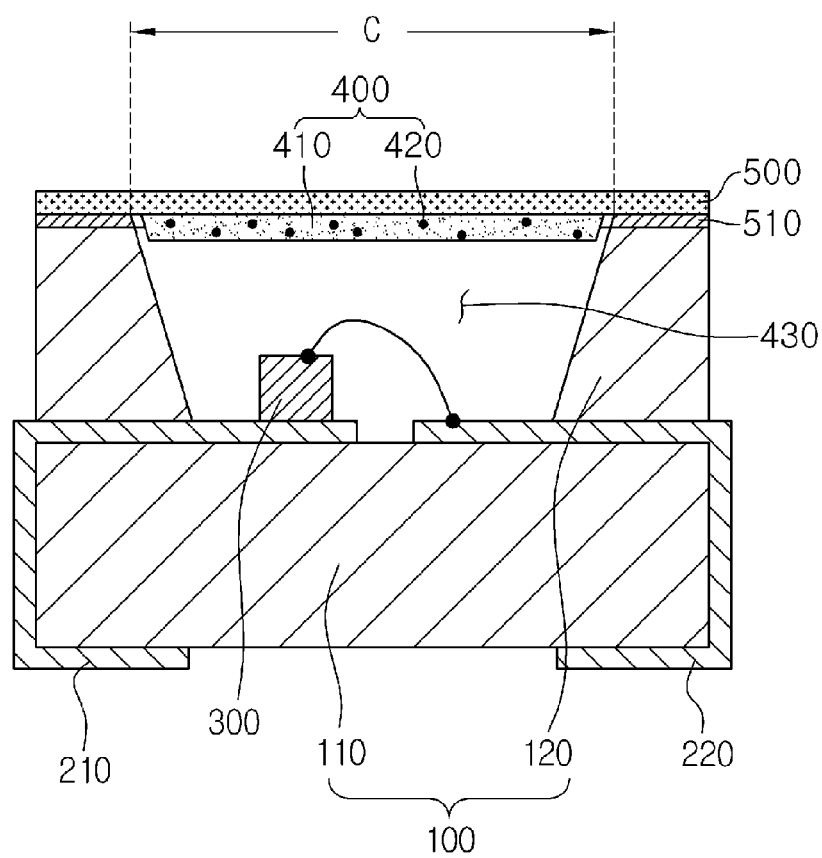
FIG. 2 is a sectional view taken along line A-A' of FIG. 1.

FIG. 1 is a perspective view showing a light emitting diode package according to the embodiment, and FIG. 2 is a sectional view taken along line A-A' of FIG. 1.

Referring to FIGS. 1 and 2, a light emitting diode package according to the embodiment includes a body part 100, lead electrodes 210 and 220, a light emitting chip 300, a light conversion part 400, and a cover part 500.

The body part 100 may include one of a resin material such as epoxy or polyphthalamide (PPA), a ceramic material, a liquid crystal polymer (LCP), syndiotactic (SPS), poly(phenylene ether (PPS), and a silicon material. However, the material of the body part 100 is not limited thereto.

The body part 100 includes a cavity C having an open upper portion. The cavity C may be formed by performing a patterning process, a punching process, a cutting process, or an etching process with respect to the body part 100. In addition, the cavity C may be formed by a metallic cast having the shape of the cavity C when the body part 100 is molded.

The cavity C may have a cup shape or a concave container shape. In addition, the surface of the cavity C may have a circular shape, a polygonal shape, or a random shape, but the embodiment is not limited thereto.

The internal lateral side of the cavity C may be perpendicular to the bottom surface of the cavity C or may be inclined with respect to the bottom surface of the cavity C by taking a light distribution angle of a light emitting diode (LED) according to the embodiment into consideration.

The body part 100 may include a base part 110 and an outer wall 120.

The base part 110 supports the outer wall 120. In addition, the base part 110 supports the lead electrodes 210 and 220. The base part 110 may have a rectangular parallelepiped shape.

The outer wall 120 is provided on the base part 100. The cavity C is defined by the outer wall 120. In other words, the cavity C is a groove formed in the outer wall 120. The outer wall 120 surrounds the cavity C. The outer wall 120 may have a closed loop shape when viewed from the top. For example, the outer wall 120 may have a wall shape surrounding the cavity C.

The outer wall 120 includes a top surface, an outer lateral side, and an internal lateral side. The internal lateral side is inclined with respect to the top surface.

A reflective layer may be formed on the internal lateral side of the cavity C. In other words, a material, such as white photo solder resist (PSR) ink, silver (Ag), or aluminum (Al), representing a high reflection effect may be coated or applied onto the internal lateral side of the outer wall 120. Accordingly, the light emission efficiency of the light emitting diode package according to the embodiment can be improved.

The lead electrodes 210 and 220 may be integrally formed with the body part 100. In more detail, two lead electrodes 210 and 220 may be provided in one body part. The lead electrodes 210 and 220 may be realized in a lead frame, but the embodiment is not limited thereto.

The lead electrodes 210 and 220 are provided in the body part 100. The lead electrodes 210 and 220 may be provided on a bottom surface of the cavity C while being electrically insulated from each other. Outer portions of the lead electrodes 210 and 220 may be exposed out of the body 100. In more detail, the lead electrodes 210 and 220 are provided in the base part 110.

End portions of the lead electrodes 210 and 220 may be provided on one lateral side of the cavity C or an opposite lateral side of the cavity C.

The lead electrodes 210 and 220 may be provided in the lead frame. The lead frame may be formed when the body part 100 is formed through injection molding. For example, the lead electrodes 210 and 220 may include a first lead electrode 210 and a second lead electrode 220.

The first lead electrode 210 is spaced apart from the second lead electrode 220. The first and second lead electrodes 210 and 220 may be electrically connected to the light emitting chip 300.

The light emitting chip 300 is provided in the cavity C. The light emitting chip 300 serves as a light emitting part to emit light. In more detail, the light emitting chip 300 may include a light emitting diode chip to emit light. For example, the light emitting chip 300 may include a colored LED chip or a UV LED chip. One light emitting chip 300 may be provided in one cavity C.

The light emitting chip 300 may be a vertical light emitting diode chip. The light emitting chip 300 may include a conductive substrate, a reflective layer, a first conductive semiconductor layer, a second conductive semiconductor layer, an active layer, and a second electrode.

The conductive substrate includes a conductor. The conductive substrate supports the reflective layer, the first conductive semiconductor layer, the second conductive semiconductor layer, the active layer, and the second electrode.

The conductive substrate is connected to the first conductive semiconductor layer through the reflective layer. In other words, the conductive substrate is a first electrode to apply an electrical signal to the first conductive semiconductor layer.

The reflective layer is provided on the conductive substrate. The reflective layer reflects upward light emitted from the active layer. In addition, the reflective layer is a conductive layer. Accordingly, the reflective layer connects the conductive substrate to the first conductive semiconductor layer. The material constituting the reflective layer may include metal such as silver (Ag) or aluminum (Al).

The first conductive semiconductor layer is provided on the reflective layer. The first conductive semiconductor layer has a first conductive type. The first conductive semiconductor layer may include an N type semiconductor layer. For example, the first conductive semiconductor layer may include an N type GaN layer.

The second conductive semiconductor layer is provided on the first conductive semiconductor layer. The second conductive semiconductor layer faces the first conductive semiconductor layer, and may include a P type semiconductor layer. For example, the second conductive semiconductor layer may include a P type GaN layer.

The active layer is interposed between the first and second conductive semiconductor layers. The active layer has a single quantum well structure or a multiple-quantum well structure. The active layer may be formed in the stack structure of an InGaN well layer and an AlGaN barrier layer, the stack structure of an InGaN well layer and a GaN barrier layer. The light emitting material of the active layer may vary according to light emission wavelengths such as a blue wavelength, a red wavelength, or a green wavelength.

The second electrode is provided on the second conductive semiconductor layer. The second electrode is connected to the second conductive semiconductor layer.

In addition, the light emitting chip 300 may include a horizontal LED. In this case, an additional wire may be required in order to connect the horizontal LED to the first lead electrode 210.

The light emitting chip 300 may be connected to the first lead electrode 210 through a bump, and may be connected to the second lead electrode 220 through a wire. In particular, the light emitting chip 300 may be directly provided on the first lead electrode 210.

In addition, the embodiment is not limited to the above connection scheme, but the light emitting chip 300 may be connected to the lead electrodes 210 and 220 through a wire bonding scheme, a die bonding scheme, or a flip-bonding scheme. In addition, the embodiment is not limited thereto.

The light conversion part 400 is provided in the cavity C. The light conversion part 400 is provided on the light emitting chip 300. The light conversion part 400 is provided under the cover part 500. The light conversion part 400 is provided on a bottom surface of the cover part 500. The light conversion part 400 may be directly provided on the bottom surface of the cover part 500. The light conversion part 400 is spaced apart from the light emitting chip. Therefore, an air layer (430) is provided between the light conversion part 400 and the light emitting chip.

The air layer (430) may serve as an adiabatic layer. Therefore, the heat generated from the light emitting chip 300 can be prevented from being transferred to the light conversion part 400. Therefore, the light emitting diode package according to the embodiment can prevent the light conversion part 400 from being denaturized due to the heat emitted from the light emitting chip 300.

The light conversion member 400 receives the light from the light emitting diodes 300 to convert the wavelength of the light. For instance, if the light emitting chip 300 emits blue light, the light conversion member 400 may convert the blue light into the green light and the red light. In detail, the light conversion member 400 may convert a part of the blue light into the green light having the wavelength in the range of about 520 nm to about 560 nm, and another part of the blue light into the red light having the wavelength in the range of about 630 nm to about 660 nm.

In addition, if the light emitting chip 300 emits UV light, the light conversion part 400 may convert the UV light into the blue light, the green light and the red light. In detail, the light conversion part 400 may convert a part of the UV light into the blue light having the wavelength in the range of about 430 nm to about 470 nm, a part of the UV light into the green light having the wavelength in the range of about 520 nm to about 560 nm, and a part of the UV light into the red light having the wavelength in the range of about 630 nm to about 660 nm.

Therefore, the white light can be generated by the light passing through the light conversion part 400 and the lights converted by the light conversion part 400. In detail, the light emitting diode can output the white light through the combination of the blue light, the green light and the red right.

In addition, the light emitting diode according to the embodiment may emit only red light or only green light.

In more detail, the light conversion part 400 includes a host 410 and a plurality of light conversion particles 420.

The host 410 is provided on the bottom surface of the cover part 500. In more detail, the host 410 may adhere to the bottom surface of the cover part 500. The host 410 may include a material such as silicon-based resin.

The light conversion particles 420 are provided in the host 410. In more detail, the light conversion particles 420 may be uniformly dispersed in the host 410.

The light conversion particles 420 convert the wavelength of the light incident light. In more detail, the light conversion particles 420 may convert the wavelength of the light emitted from the light emitting chip 300.

The light conversion particles 420 convert the blue light from the light emitting chip 300 into the green light or the red light. In detail, a part of the light conversion particles 420 may convert the blue light into the green light having the wavelength in the range of about 520 nm to about 560 nm, and a part of the light conversion particles 420 may convert the blue light into the red light having the wavelength in the range of about 630 nm to about 660 nm.

In addition, the light conversion particles 420 can convert the UV light emitted from the light emitting chip 300 into the blue light, the green light and the red light. That is, a part of the light conversion particles 420 converts the UV light into the blue light having the wavelength in the range of about 430 nm to about 470 nm, and another part of the light conversion particles 420 converts the UV light into the green light having the wavelength in the range of about 520 nm to about 560 nm.

Further, a part of the light conversion particles 420 converts the UV light into the red light having the wavelength in the range of about 630 nm to about 660 nm.

The light conversion particles 420 may include a plurality of quantum dots.

The quantum dots may include core nano-crystals and shell nano-crystals surrounding the core nano-crystals. In addition, the quantum dots may include organic ligands bonded with the shell nano-crystals. Further, the quantum dots may include organic coating layers surrounding the shell nano-crystals.

The shell nano-crystals may be prepared at least two layers. The shell nano-crystals are formed on the surface of the core nano-crystals. The quantum dots can lengthen the wavelength of the light incident into the core nano-crystals by using the shell nano-crystals forming a shell layer, thereby improving the light efficiency.

The quantum dots may include at least one of a group-II compound semiconductor, a group-III compound semiconductor, a group-V compound semiconductor, and a group-VI compound semiconductor. In more detail, the core nano-crystals may include CdSe, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS. The diameter of the quantum dot may be in the range of 1 nm to 10 nm.

The wavelength of the light emitted from the quantum dots can be adjusted according to the size of the quantum dot or the molar ratio between the molecular cluster compound and the nano-particle precursor in the synthesis process. The organic ligand may include pyridine, mercapto alcohol, thiol, phosphine and phosphine oxide. The organic ligand may stabilize the unstable quantum dots after the synthesis process. Dangling bonds may be formed at the valence band and the quantum dots may be unstable due to the dangling bonds. However, since one end of the organic ligand is the non-bonding state, one end of the organic ligand is bonded with the dangling bonds, thereby stabilizing the quantum dots.

In particular, if the size of the quantum dot is smaller than the Bohr radius of an exciton, which consists of an electron and a hole excited by light and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general phosphorous pigments, the fluorescent wavelength of the quantum dot may vary depending on the size of the particles. In detail, the light has the shorter wavelength as the size of the particle is reduced, so that the phosphorous light having the wavelength band of visible ray can be generated by adjusting the size of the particles. In addition, the quantum dot represents the extinction coefficient which is 100 to 1000 times higher than that of the general phosphorous pigment and has the superior quantum yield as compared with the general fluorescent pigment, so that strong fluorescent light can be generated.

The quantum dots can be synthesized through the chemical wet scheme. The chemical wet scheme is to grow the particles by immersing the precursor material in the organic solvent. According to the chemical wet scheme, the quantum dots can be synthesized.

The cover part 500 covers the light conversion part 400. In addition, the cover part 500 covers the body part 100. In more detail, the cover part 500 may cover the top surface of the outer wall 120. In other words, the cover part 500 covers the entrance of the cavity C. In other words, the cover part 500 seals the inner part of the cavity C.

The cover part 500 adheres to the body part 100. In more detail, an adhesive layer 510 is interposed between the cover part 500 and the body part 100, and the cover part 500 adheres to the body part 100 through the adhesive layer 510. The cover part 500 may adhere to the top surface of the outer wall 120.

The thickness of the cover part 500 may be in the range of about 0.7 mm to about 2.0 mm.

The cover part 500 is transparent. The cover part 500 may have a plate shape. In addition, the cover part 500 may have a lens shape. The material constituting the cover part 500 may include glass or plastic.

If the cover part 500 includes glass, the cover part 500 can protect the light conversion particles 420 from oxygen and/or moisture.

The cover part 500 protects the light conversion part 400 from physical and/or chemical shock. In more detail, the cover part 500 can prevent moisture and/or oxygen from being infiltrated into the top surface, the bottom surface, and the lateral side of the light conversion part 400.

Accordingly, the cover part 500 can prevent the light conversion particles 420 from being denaturalized by the moisture and/or oxygen, so that the reliability and the durability of the light emitting diode package according to the embodiment can be improved.

As described above, according to the light emitting device package of the embodiment, the light conversion part 400 is provided on the bottom surface of the cover part 500. In addition, the light conversion part 400 is spaced apart from the light emitting chip 300. In other words, after the light conversion part 400 has been provided on the bottom surface of the cover part 500, the cover part 500 may adhere to the body part 100.

In other words, the light conversion part 400 is not directly formed in the body part 100, but formed on the cover part 500. In this case, the cover part 500 may have a flat bottom surface, and the light conversion part 400 may be easily formed on the flat surface.

Therefore, the light emitting device package according to the embodiment can be easily fabricated without a process of injecting the light conversion part 400 into the cavity C.

In addition, since the light conversion part 400 is spaced apart from the light emitting chip 300, the heat emitted from the light emitting chip 300 can be prevented from being transferred to the light conversion part 400. In particular, the heat generated from the light emitting chip 300 may be discharged in a lateral direction by an adiabatic layer.

Accordingly, the light emitting device package according to the embodiment can prevent the light conversion part 400 from being denaturalized by a heat. Therefore, the light emitting device package according to the embodiment can represent improved reliability and improved durability.

Figure 3:
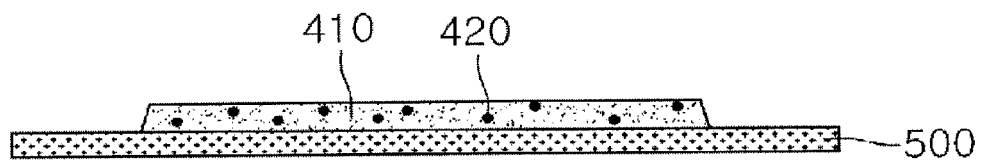
FIGS. 3 and 4 are sectional views showing the fabricating process of the light emitting diode package according to the embodiment.
Figure 4:
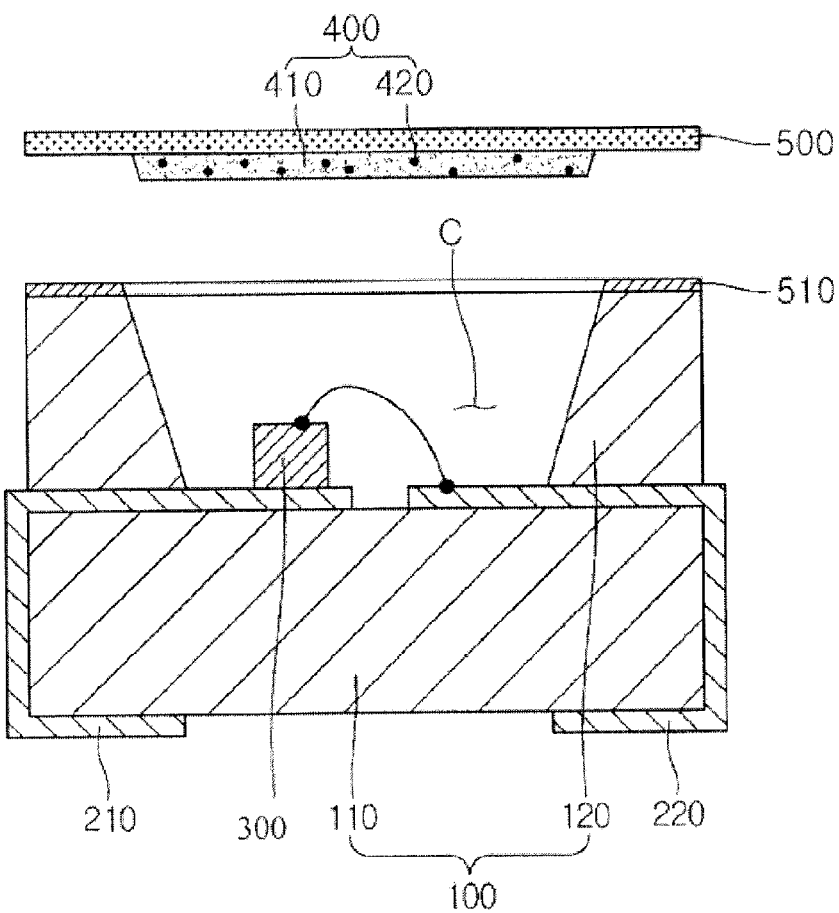

FIGS. 3 and 4 are sectional views showing the fabricating process of a light emitting diode package according to the embodiment. Hereinafter, the fabricating method according to the present embodiment will be described by making reference to the description of the light emitting diode package. In other words, the description of the light emitting diode package will be incorporated in the description of the fabricating method.

Referring to FIG. 3, the cover part 500 and the light conversion part 400 are formed. The resin composition including a plurality of the light conversion particles 420 is coated on the cover part 500, and the coated resin composition is cured, thereby forming the light conversion part 400 is formed.

A plurality of cover parts 500 may be formed at one time. For example, after coating a plurality of light conversion parts 400 on a transparent substrate, the transparent substrate is cut, so that the cover parts 500 may be formed.

Referring to FIG. 4, the body part 100 and the lead electrodes 210 and 220 are provided. The body part 100 may be formed through a double injection process. Thereafter, the light emitting chip 300 is mounted in the body part 100. The light emitting chip 300 may be connected to the lead electrodes by a wire.

Thereafter, the adhesive layer 510 is formed on the top surface of the body part 100. The adhesive layer 510 may be coated on the top surface of the outer wall 120 of the body part 100.

Thereafter, the cover part 500 adheres to the body part 100. The cover part 500 adheres to the body part 100 in such a manner that the cover part 500 covers the cavity C of the body part 100 and seals the cavity C.

Therefore, the light emitting diode package according to the embodiment may be fabricated.

As described above, the light conversion part 400 is formed on the cover part 500 without directly being formed in the body part 100. In this case, the cover part 500 may have a flat bottom surface, so that the light conversion part 400 may be easily formed on a flat surface. The light conversion part 400 is printed on the transparent substrate, and the transparent plate may be cut into a plurality of cover parts 500. The cover part 500 having the above structure may adhere to the body part 100.

Therefore, the light emitting device package according to the embodiment may be easily formed without a process of injecting the light conversion part 400 into the cavity C.

Figure 5:
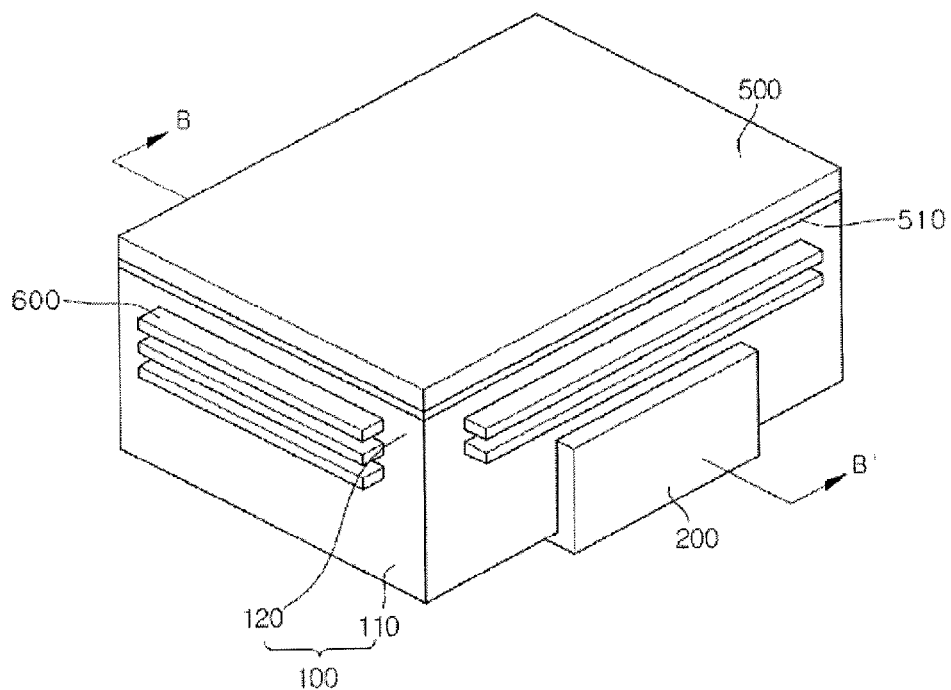
FIG. 5 is a perspective view showing a light emitting diode package according to a second embodiment.
Figure 6:
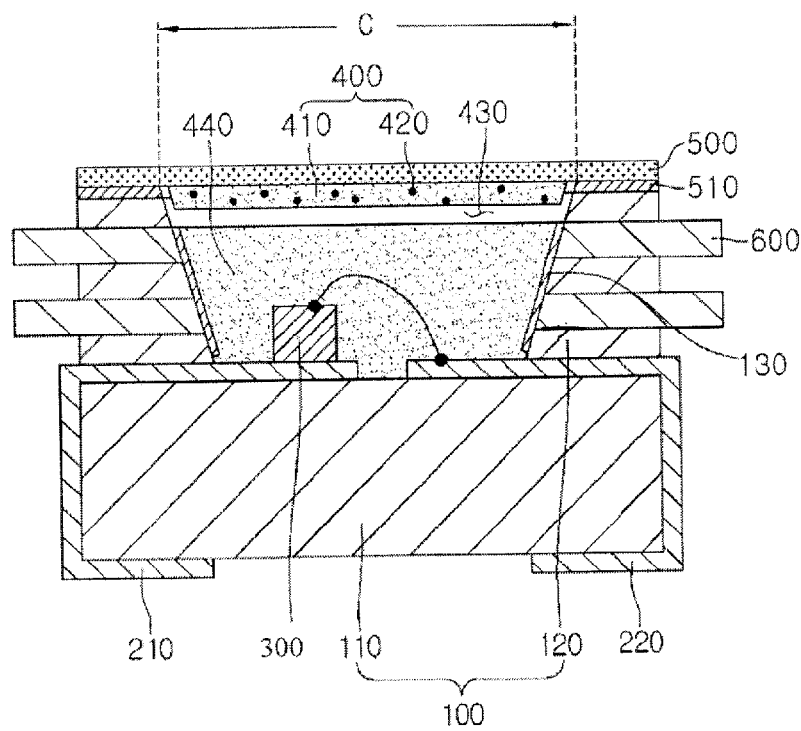
FIG. 6 is a sectional view taken along line B-B' of FIG. 5.

FIG. 5 is a perspective view showing a light emitting diode package according to the second embodiment. FIG. 6 is a sectional view taken along line B-B' of FIG. 5. Hereinafter, the description of the present embodiment will be made by making reference to the description of the light emitting diode package and the method of fabricating the same. In other words, the description of the light emitting diode package and the method of fabricating the same will be incorporated in the description of the present embodiment.

Referring to FIG. 6, the light emitting diode package according to the embodiment includes a heat transfer layer 440 and a heat radiation part 600.

The heat transfer layer 440 is provided in the cavity C. The heat transfer layer 440 is interposed between the heat transfer layer 440 and the light emitting chip. In more detail, the heat transfer layer 440 is interposed between the air layer (430) and the light emitting chip 300. In other words, the heat transfer layer 440 is interposed between the adiabatic layer and the light emitting chip 300.

The heat transfer layer 440 may directly make contact with the light emitting chip 300. The heat transfer layer 440 can transfer heat generated from the light emitting chip 300 to the heat radiation part 600. The heat transfer layer 440 is transparent and can represent high thermal conductivity. In more detail, the heat transfer layer 440 represents thermal conductivity higher than that of the air layer.

The material constituting the heat transfer layer 440 may include transparent polymer. In this case, the heat transfer layer 440 may include particles representing high thermal conductivity. In other words, the heat transfer layer 440 may include metallic particles or metallic compound particles.

The heat transfer layer 440 is spaced apart from the light conversion part 400. Therefore, the air layer 430 is interposed between the heat transfer layer 440 and the light conversion part 400.

A reflective layer 130 is formed on the internal lateral side of the outer wall 120. The reflective layer 130 represents high reflectance. The reflective layer 130 may include metal. In addition, the reflective layer 130 may include a white painted layer.

The heat radiation part 600 is connected to the heat transfer layer 440. In more detail, the heat radiation part 600 may be connected to the heat transfer layer 440 through the reflective layer 130. In addition, the heat radiation part 600 may be directly connected to the heat transfer layer 440. The heat radiation part 600 discharges heat, which is received from the heat transfer layer 440, to the outside. The heat radiation part 600 may include a material representing high thermal conductivity. The heat radiation part 600 may include metal such as aluminum (Al) or copper (Cu).

The heat radiation part 600 may pass through the outer wall 120. In other words, the heat radiation part 600 may extend from the inner part of the cavity C to the outside of the body part 100 through the outer wall 120. A portion of the heat radiation part 600 is exposed to the outside of the body part 100.

The heat radiation part 600 may pass through the base part 110. In other words, the heat radiation part 600 may extend downward from the bottom surface of the cavity C so that the heat radiation part 600 may be exposed to the outside of the body part 100.

As described above, the heat radiating upward from the light emitting chip 300 may be emitted in a lateral direction by the heat transfer layer 440 and the heat radiation part 600.

Therefore, the light emitting diode package according to the present embodiment can effectively protect the light conversion particles 420 from the heat emitted from the light emitting chip 300. Therefore, the light emitting diode package according to the embodiment can represent improved reliability and durability.

Figure 7:
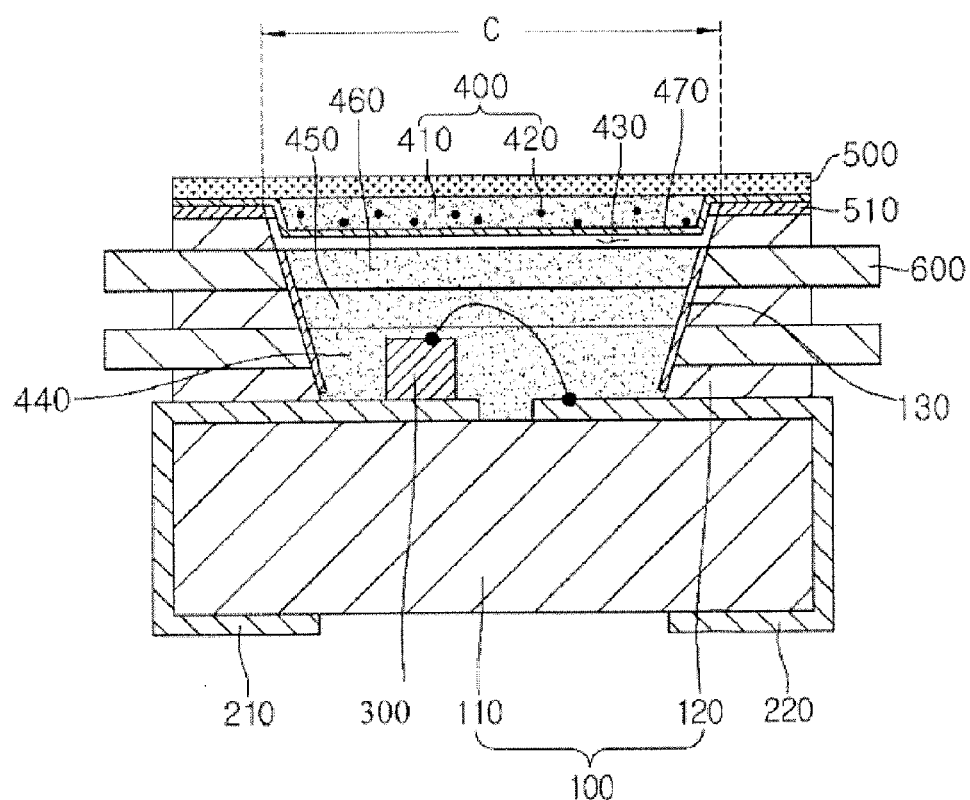
FIG. 7 is a sectional view showing a light emitting diode package according to a third embodiment.

FIG. 7 is one sectional view showing a light emitting diode package according to a third embodiment. The present embodiment will be described by making reference to the above description of the light emitting diode package and the method of fabricating the same. In other words, the description of the light emitting diode package and the method of fabricating the same will be incorporated in the description of the present embodiment.

Referring to FIG. 7, the light emitting diode package according to the present embodiment includes a first heat transfer layer 440, a first adiabatic layer 450, a second heat transfer layer 460, a second adiabatic layer 430, and a protective layer 470.

The first heat transfer layer 440 is provided in the cavity C. The first heat transfer layer 440 covers the light emitting chip 300. The first heat transfer layer 440 is provided the bottom surface of the cavity C. The first heat transfer layer 440 represents high thermal conductivity. The first heat transfer layer 440 may represent thermal conductivity higher than that of the first adiabatic layer 450 and the second adiabatic layer 430.

The material constituting the first heat transfer layer 440 may include transparent polymer. In this case, the first heat transfer layer 440 may include particles representing high thermal conductivity. In other words, the first heat transfer layer 440 may include metallic particles or metallic compound particles.

The first adiabatic layer 450 is provided on the first heat transfer layer 440. The first adiabatic layer 450 may directly make contact with the first heat transfer layer 440. The first adiabatic layer 450 represents low thermal conductivity. The first adiabatic layer 450 represents thermal conductivity lower than that of the first and second heat transfer layers.

For example, the material constituting the first adiabatic layer 450 may include transparent polymer such as silicon-based resin or epoxy-based resin. The first adiabatic layer 450 may include polymer representing low thermal conductivity. In addition, the first adiabatic layer 450 may include a plurality of pores. The first adiabatic layer 450 can represent low thermal conductivity due to the pores.

The second heat transfer layer 460 is provided on the first adiabatic layer 450. The second heat transfer layer 460 may be directly provided on the top surface of the first adiabatic layer 450. The second heat transfer layer 460 represents high thermal conductivity. For example, the second heat transfer layer 460 represents thermal conductivity higher than the first and second adiabatic layers 450 and 430.

The material constituting the second heat transfer layer 460 may include transparent polymer. In this case, the second heat transfer layer 460 may include particles representing high thermal conductivity. In other words, the second heat transfer layer 460 may include metallic particles or metallic compound particles.

The second adiabatic layer 430 is provided on the second heat transfer layer 460. The second adiabatic layer 430 represents low thermal conductivity. The second adiabatic layer 430 serves as the air layer. Accordingly, the second adiabatic layer 430 represents thermal conductivity lower than the first and second heat transfer layers 440 and 460.

As described above, a plurality of heat transfer layers 440 and 460 and a plurality of adiabatic layers 430 and 450 are alternately provided. Although drawings show two heat transfer layers 440 and 460 and two adiabatic layers 430 and 450, the embodiment is not limited thereto. Accordingly, more many heat transfer layers and adiabatic layers may be alternately provided. For example, in the light emitting diode package according to the embodiment, a third adiabatic layer may be provided between the second adiabatic layer 430 and the second heat transfer layer 460, and a third heat transfer layer may be provided between the second adiabatic layer 430 and the third adiabatic layer.

In addition, the heat radiation part 600 is connected to the first and second heat transfer layers 440 and 460. Therefore, the heat radiation part 600 may discharge heat from the first and second heat transfer layers 440 and 460 to the outside.

In addition, a plurality of heat radiation parts 600 may be provided, and one of the heat radiation parts 600 may be provided corresponding to the first heat transfer layer 440. In other words, the first heat transfer layer 440 may mainly transfer heat to the related heat radiation part 600. In addition, another heat radiation part 600 may be provided corresponding to the second heat transfer layer 460. In other words, the second heat transfer layer 460 may mainly transfer heat to the heat radiation part 600.

In particular, since the heat transfer layers and the adiabatic layers are alternately provided, and the heat radiation part 600 is provided at the outer wall 120, the heat emitted from the light emitting chip 300 may be transferred in a lateral direction.

Therefore, according to the light emitting diode package of the present invention, the light conversion particles 420 can be prevented from being denaturalized by heat.

In addition, the protective layer 470 covers the light conversion part 400. In addition, the protective layer 470 is provided under the light conversion part 400. The protective layer 470 is provided on a bottom surface and a lateral side of the light conversion part 400. In addition, the protective layer 470 is provided on the bottom surface of the cover part 500.

The protective layer 470 may directly make contact with the bottom surface of the cover part 500.

In addition, the protective layer 470 may include an inorganic material. The protective layer 470 may include a transparent inorganic material such as silicon oxide. In addition, the cover part 500 may include glass. Therefore, the adhesive strength between the protective layer 470 and the cover part 500 may be more enhanced.

As described above, the protective layer 470 may seal the light conversion part 400. In other words, the protective layer 470 directly makes contact with the cover part 500 while sandwiching the light conversion part 400 therebetween. Therefore, the protective layer 470 and the cover part 500 can effectively seal the light conversion part 400.

Therefore, the cover part 500 and the protective layer 470 can effectively prevent the light conversion particles 420 contained in the light conversion part 400 from being denaturalized due to external moisture and/or external oxygen.

Therefore, the light emitting diode package according to the embodiment can represent improved reliability and improved durability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic are described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device package comprising:
   a body part provided therein with a cavity;
   a light emitting chip in the cavity;
   a cover part to cover the cavity;
   a light conversion part provided under a bottom surface of the cover part while being separated from the light emitting chip;
   an adiabatic layer interposed between the light emitting chip and the light conversion part;
   a heat radiation part attached to the body part; and
   a heat transfer layer interposed between the adiabatic layer and the light emitting chip and representing thermal conductivity higher than thermal conductivity of the adiabatic layer.

2. The light emitting device package of claim 1, wherein the light conversion part directly makes contact with the bottom surface of the cover part.

3. The light emitting device package of claim 2, wherein the light conversion part comprises:
   a host directly making contact with the bottom surface of the cover part; and a plurality of light conversion particles in the host.

4. The light emitting device package of claim 1, further comprising a protective layer provided on the bottom surface of the cover part, a lateral side of the light conversion part, and a bottom surface of the light conversion part.

5. The light emitting device package of claim 4, wherein the protective layer directly makes contact with the cover part.

6. The light emitting device package of claim 5, wherein the cover part and the protective layer include an inorganic material.

7. The light emitting device package of claim 1, further comprising an adhesive layer interposed between the cover part and the body part to adhere to the cover part and the body part.

8. A light emitting device package comprising:
a light emitting chip;
a heat transfer layer on the light emitting chip;
an adiabatic layer provided on the heat transfer layer to represent thermal conductivity lower than thermal conductivity of the heat transfer layer;
a light conversion part on the adiabatic layer; and
a heat radiation part connected to the heat transfer layer.

9. The light emitting device package of claim 8, wherein the adiabatic layer includes an air layer.

10. The light emitting device package of claim 8, wherein the heat transfer layer includes transparent polymer and a plurality of metallic particles or metallic compound particles provided in the transparent polymer.

11. The light emitting device package of claim 8, further comprising a body part receiving the light emitting chip and the heat transfer layer,
wherein the body part comprises:
a base part under the light emitting chip; and
an outer wall extending upward from the base part and surrounding the heat transfer layer, and
wherein the heat radiation part passes through the outer wall.

12. The light emitting device package of claim 11, further comprising a reflective layer on an internal surface of the outer wall, wherein the heat radiation part is connected to the heat transfer layer through the reflective layer.

13. The light emitting device package of claim 8, further comprising a cover part provided on the light conversion part, wherein the adiabatic layer is provided on a bottom surface of the light conversion part, a lateral side of the light conversion part, and a bottom surface of the cover part.

14. The light emitting device package comprising:
a light emitting chip;
a first heat transfer layer on the light emitting chip;
a first adiabatic layer on the first heat transfer layer;
a second heat transfer layer on the first adiabatic layer;
a second adiabatic layer on the second heat transfer layer; and
a light conversion part on the second adiabatic layer.

15. The light emitting device package of claim 14, further comprising a third heat transfer layer interposed between the second adiabatic layer and the light conversion part; and
a third adiabatic layer interposed between the third heat transfer layer and the light conversion part.

16. The light emitting device package of claim 14, wherein the first adiabatic layer or the second adiabatic layer includes an air layer.

17. The light emitting device package of claim 14, further comprising a heat radiation part connected to the first heat transfer layer and the second heat transfer layer.

18. The light emitting device package of claim 17, further comprising a reflective layer provided at lateral sides of the first heat transfer layer, the first adiabatic layer, the second heat transfer layer, and the second adiabatic layer, wherein the first and second heat transfer layers are connected to the heat radiation part through the reflective layer.

19. The light emitting device package of claim 1, further comprising an air layer between the light emitting chip and the cover part.

20. The light emitting device package of claim 1, wherein the heat radiation part comprises a metal.

21. The light emitting device package of claim 1, wherein the cover part comprises glass.

* * * * *